United States Patent
Shanker et al.

(10) Patent No.: US 9,513,334 B2
(45) Date of Patent: Dec. 6, 2016

(54) SYSTEM ON A CHIP FPGA SPATIAL DEBUGGING USING SINGLE SNAPSHOT

(71) Applicant: Microsemi SoC Corporation, San Jose, CA (US)

(72) Inventors: Pankaj Mohan Shanker, Cupertino, CA (US); Ming-Hoe Kiu, Belmont, CA (US); Mikhail Ivanovich Chukhlebov, San Jose, CA (US)

(73) Assignee: Microsemi SoC Corporation, San Jose, CA (US)

( * ) Notice: Subject to any disclaimer, the term of this patent is extended or adjusted under 35 U.S.C. 154(b) by 78 days.

(21) Appl. No.: 14/212,508

(22) Filed: Mar. 14, 2014

(65) Prior Publication Data

US 2014/0281775 A1    Sep. 18, 2014

Related U.S. Application Data

(60) Provisional application No. 61/798,074, filed on Mar. 15, 2013.

(51) Int. Cl.
*G01R 31/3177* (2006.01)
*G01R 31/00* (2006.01)
*G01R 31/317* (2006.01)
*G01R 31/3185* (2006.01)

(52) U.S. Cl.
CPC . *G01R 31/31705* (2013.01); *G01R 31/318544* (2013.01); *G01R 31/318558* (2013.01)

(58) Field of Classification Search
None
See application file for complete search history.

(56) References Cited

U.S. PATENT DOCUMENTS

| | | | |
|---|---|---|---|
| 7,072,818 B1* | 7/2006 | Beardslee et al. | 703/14 |
| 7,673,201 B1* | 3/2010 | Chan et al. | 714/725 |
| 8,072,234 B2* | 12/2011 | Fox | 326/16 |
| 8,151,231 B2* | 4/2012 | Bailey | G01R 31/318544 345/208 |
| 8,640,070 B2* | 1/2014 | Asaad et al. | 716/116 |
| 8,788,886 B2* | 7/2014 | Chong et al. | 714/38.11 |
| 2006/0290400 A1* | 12/2006 | Bailey | G01R 31/318558 327/202 |

(Continued)

OTHER PUBLICATIONS

SmartFusion2 SoC FPGAs, http://www.microsemi.com/products/fpga-soc/soc-fpga/smartfusion2, 3 pages.

(Continued)

*Primary Examiner* — Justin R Knapp
(74) *Attorney, Agent, or Firm* — Leech Tishman Fuscaldo & Lampl; Kenneth D'Alessandro, Esq.

(57) ABSTRACT

A method for performing on-chip spatial debugging of a user circuit programmed into a user-programmable integrated circuit includes halting an internal clock driving synchronous logic elements in the integrated circuit and reading the states of all synchronous logic elements programmed into the integrated circuit while the internal clock is halted. An interrupt to an embedded processor in the integrated circuit running a user application can also be generated. The output of at least one synchronous logic element can be forced to a desired state while the internal clock is halted. The clock can then be restarted or stepped.

5 Claims, 7 Drawing Sheets

(56) References Cited

U.S. PATENT DOCUMENTS

2009/0006894 A1\* 1/2009 Bellofatto ........... G06F 11/2236
                                                          714/34
2013/0262072 A1\* 10/2013 Asaad et al. .................... 703/13
2013/0262073 A1\* 10/2013 Asaad et al. .................... 703/14

OTHER PUBLICATIONS

Dev Kits & Boards, http://www.microsemi.com/products/fpga-soc/design-resources/dev-kits-boards, 2 pages.
SmartFusion2 SoC FPGAs—Documents, http://www.microsemi.com/products/fpga-soc/soc-fpga/sf2docs#documents, 4 pages.

\* cited by examiner

SYSTEM ON A CHIP FPGA SPATIAL DEBUGGING USING SINGLE SNAPSHOT

CROSS REFERENCE TO RELATED APPLICATION

This application claims the benefits of U.S. Provisional Patent Application No. 61/798,074, filed Mar. 15, 2013, and titled "System on a Chip FPGA Spatial Debugging Using Single Snapshot", which application is incorporated herein by reference in its entirety.

BACKGROUND OF THE INVENTION

Field of the Invention

The present invention relates to programmable integrated circuit technology, and specifically to system on a chip (SoC) technology. More particularly, the present invention relates to providing 100% visibility, and exercising 100% controllability on single-clock domain, synchronous SoC-FPGA design, by way of creating a spatial snapshot, obtained from dynamically configurable trigger without altering the original design being debugged.

Description of Related Art

It is desirable to provide complete visibility and controllability of a single-clock domain, synchronous system on a chip field programmable gate array (SoC-FPGA) design, by way of creating a spatial snapshot, obtained from a dynamically configurable trigger without altering an original design being debugged. A spatial snapshot of the SoC-FPGA represents the state of all of the memory elements, such as all of the flip-flops and all of the memory cells (SRAM, etc.) utilized in the design.

There is no known method to create a snapshot of the entire FPGA design using a dynamically configurable trigger and to then exercise execution control to influence the design without altering the structure of the design.

The SmartFusion2 (SF2) SoC-FPGA manufactured and marketed by the SoC Products Group of Microsemi Corporation is unique in its architecture as it enables the reading and writing of all of its memory elements, e.g., flip-flops, SRAM memory cells, etc.

The SmartDebug application running on a PC connected to an SF2 integrated circuit via JTAG or SPI interfaces allows the user to dynamically configure the trigger and retrieve the state of all of the memory elements upon encountering the trigger. It also provides options for execution control. The availability of both JTAG and SPI interfaces enables debugging with multiple tools on different interfaces simultaneously.

Referring now to FIG. 1, a flow diagram depicts a prior art chronological debug procedure indicated generally at reference numeral 10. At reference numeral 12, a circuit design is input to the system. The circuit design may be in the form of either schematic capture of the digital logic to be synthesized or RTL, which is synthesizable HDL (hardware description language) code typically written in Verilog/VHDL, etc. Optional design constraints 14, such as synthesis directives, may be attached to specific modules in the design input. Examples of synthesis directives are timing constraints (clock frequency, false and multi-cycle paths, etc.), location constraints, one-hot encoding of FSMs, fan-out limits, net/module preservation, logic replication, etc.

At reference numeral 16, the circuit design input 12 and constraints 14 are provided to synthesis software (a compiler that translates RTL (register transfer level) into logic gates), which produces an EDIF netlist at reference numeral 18 along with constraints 20. EDIF (electronic design interchange format) is a vendor-neutral format in which to store electronic netlists and schematics. Constraints 20 are FPGA vendor-specific design constraints, such as map, place, and route directives attached to specific modules in design input. Examples of FPGA vendor-specific design constraints are timing constraints (clock frequency, false and multi-cycle paths, etc.), location constraints, area (floor-planning) constraints, and vendor-specific attributes, etc.

The EDIF netlist 18 and constraints 20 are provided to map, place, and route software 22 to produce a proprietary netlist 24. Map, place, and route software is a vendor-specific back-end tool that translates EDIF netlist into a vendor-specific proprietary netlist that contains the entire design implementation for the target FPGA device. The proprietary netlist 24 is provided to program file generator software 26 (a vendor-specific back-end tool that translates the proprietary netlist into a proprietary bitstream file) to produce a proprietary programming file 28 (a vendor-specific proprietary bitstream file that contains the design). At reference numeral 30, an FPGA programming tool is used to program the design into an FPGA integrated circuit 32 on a circuit board. The FPGA programming tool is a vendor-specific programming application that uses a proprietary programming file to configure, via proprietary cable hardware, the target hardware device (FPGA).

For a given design, the debug process begins with the processes described with respect to reference numerals 12, 14, 16, 18, 20, 22, 24, 26, 28, 30, and 32. After the integrated circuit has been programmed, an external stimulus, at reference numeral 34, can be applied to the system including integrated circuit 32. The external stimulus 34 is a logical vector sequence (of 1s and 0s) applied at the input pins of the FPGA device, i.e., the design under test (DUT). Various devices either on the board or outside of the board generate the external stimulus.

At reference numeral 36, the external system response to the stimulus is captured and presented to oscilloscope or logic analyzer 38. The external system response 36 is a logical vector sequence (of 1s and 0s) observed at the output pins of the DUT FPGA device. Various devices either on the board or outside of the board sample and/or process the external response. The logic analyzer or digital oscilloscope instrument captures, stores, and displays the external response, typically in the shape of a waveform on the monitor. It is at this step that the user determines from the response whether there is a bug in the design and whether further steps to debug as described below are required.

The response to the stimulus 34 internal to the integrated circuit is captured at reference numeral 40 and presented to an analyzer tool 42. The logical vector sequence (of 1s and 0s) is captured by the instrumented integrated logic analyzer embedded in the design. The internal response 34 can only be monitored for the signals instrumented by an instrumentor tool 44 or 46. The analyzer tool 42 is an application running on a PC that allows a user to select from the pre-determined trigger (instrumented by the intstrumentor tool), arms the integrated logic analyzer and waits to download internal response stored in the instrumented integrated logic analyzer, and displays the response typically in the shape of a waveform on the monitor. The instrumentor tools 44, 46 are applications running on a PC that instruments user-specified observation and trigger signals via an integrated logic analyzer, which gets merged with the design being debugged in the format of a synthesized netlist. User formulates hypothesis based on the observability provided by the analyzer tool 42 and invokes either the instrumentor tool 44 or 46 to alter the observability signals in the design, and adds this new observability to the design at map, place, and route software 22 or synthesis software 16, respectively.

There are problems with using prior art chronological debug processes, such as the one illustrated in FIG. 1. The prior art chronological debug process is both iterative and intrusive in nature. The faults in the design are observable in processes 34, 32, 40, 42 or 34, 32, 36, 38. Then the debug procedure cycles through processes 40, 42, 44, 22, 26, 30, 34, 40 or 40, 42, 46, 16, 22, 26, 30, 34, 40 and only ends when the bug has been discovered. This can take many loops through these processes.

As may be seen from FIG. 1, current FPGA debug technology heavily relies on iterative debug cycles, which makes it time and computation intensive. As in any debug flow, the designer would formulate a hypothesis based on the symptoms observed and decide to which part of the design is to be targeted. The designer almost always has to go through multiple hypothesis formulations, shifting the instrumentation from one logic block to another, before closing in on the root cause, i.e., the problematic area in the design. As the size of FPGA devices continues to increase and the SoC functionality continues to grow, gaining visibility and controllability into the device becomes exponentially challenging; thus drastically increasing the number of iterations required in the debug cycle. This, in turn, increases the cost of the manual debug process, the cost of re-instrumentation, and the risk associated with re-instrumentation, such as design alteration.

In order to gain visibility into multiple spatially distributed areas of the design under test (DUT), multiple instances of debug logic are required to gain visibility with often limited and precious FPGA resources, which are not always available in a densely utilized design. As a result of this shortcoming, the current FPGA technology based on iterative instrumentation and debug cannot guarantee debug success.

The success of the iterative instrument-debug cycles is a function of the availability of FPGA resources, the probability of FPGA timing closure with added instrumentation, and repeatability of the bug (i.e., fixed stimuli, fixed device under test (DUT)). Re-instrumentation is extremely undesirable because it is a manual process and, thus, susceptible to user error, it depends on the efficiencies of the tool flow (tool flow runs into several minutes for very small designs to several hours for large designs) and there is no guarantee that any given tool flow iteration will succeed in either fitting (utilization <100%) or timing closure (meets all timing constraints). This uncertainty limits the designers' visibility into their design. Even though iterative instrumentation is a common debug practice, in view of the reasons set forth above, excessive iteration (>3 attempts) is counterproductive.

Intrusive debugging processes have also been used for SoC FPGA devices. Instrumentation of the debug logic can be done using two common methods in the tool-flow, at RTL level and at post-synthesis. Instrumentation at RTL level effectively adds additional debug RTL code to the original RTL code base, while instrumentation at the post-synthesis level adds an additional netlist to the original netlist. Both methods consume additional resources (LUTs, FFs, RAMs, buffers, routing lines, etc.) and both methods alter the final placed and route netlist, which often looks very different from the original netlist.

There are several negative, unintended consequences of such intrusive debugging on the debug process. First, debug visibility is marred due to changes in netnames and FF names, and disappearance of nets and FFs during the synthesis and map optimization process. Timing changes are introduced due to placement and routing changes, fan-out on the clock(s) that are used for instrumented debug logic. In addition, the ability to reproduce a bug is crippled due to alteration of the original DUT netlist and such an alteration may have inadvertently fixed the problem (if there was a timing-related issue) or may have simply masked the problem (loss of visibility). Both outcomes, if they occur, are very difficult to identify and the process of debug becomes very challenging and time-consuming.

FPGA vendors claim to have less intrusive debugging techniques like post-layout probing using incremental place and route, but this is still intrusive in the sense that signals to be monitored have to be routed to FPGA inputs and outputs (I/Os). In most customer designs, the number of FPGA I/Os for debugging purposes are very limited and boards are often not designed with this style of FPGA debug approach. In some instances the user is prompted to cannibalize the user I/Os already in use, thereby altering the DUT. Furthermore, the incremental place and route will still add fan-out to the node being monitored, and there is no guarantee that the placer or router will succeed.

Conventional FPGA and SoC devices have limitations. While the FPGA is a great platform for emulation and SoC is great for reducing board size, the device architecture does not allow or has very limited provision for observability, controllability, and execution control.

When a certain design fails on the device, it is desirable to gain spatial and temporal visualization into the device. However, in conventional devices, this requires instrumentation in advance, i.e., the designer has to add in design specific observation points. Adding observation points in the design costs device resources and may not be possible in an over-utilized or congested design. This approach is, therefore, extremely limited in scope and fails to provide adequate, if not 100%, visibility into the design. Without good observability, a designer can analyze the execution of a circuit only by repeated execution to characterize its behavior.

Limited controllability has been an issue in bug fixing in SoC FPGA devices. Some classes of bugs are difficult to reproduce because of ineffective or extremely long (time-consuming) stimuli vectors at the device I/Os. It is often desirable to accelerate or manipulate the state transitions of certain finite state machines (FSMs) by employing localized over-ride logic (similar to force in Verilog simulations). Another demand for a controllability feature would be to induce errors into the stimulus vectors for negative testing that are otherwise difficult to achieve by applying stimuli at the device I/Os.

Once again, adding controllability is impossible in the device without instrumentation in advance. As in the case of adding observation points, adding control points consumes device resources, and it is extremely limited in scope and fails to provide adequate, if not 100%, controllability of the design.

Another aspect of debugging is the ability to control the clock in the DUT and manipulate the stimulus vector applied to the DUT. There is very limited ability within existing commercial FPGA debugging tools to control the clock in the DUT and manipulate the stimulus vector applied to the DUT. It would be useful to have the capability to freeze the DUT at interesting points in time, obtain a spatial view of all of the memory elements in the design, manipulate the stimulus vector and/or the internal states of the DUT for mimicking error injection or for overriding real-life stimuli, and then advance the clock by one or more clock cycles to capture the response. Execution control is a very common concept in firmware debugging and is applied frequently using in-circuit emulators (ICE) or debuggers. But when it comes to hardware debugging, or hardware-software co-verification, the execution control in an FPGA is limited by the architecture of the FPGA itself.

SUMMARY OF THE INVENTION

According to the present invention, a method for performing on-chip spatial debugging of a user circuit programmed into a user-programmable integrated circuit includes halting an internal clock driving synchronous logic elements in the integrated circuit and reading the states of all synchronous logic elements programmed into the integrated circuit while the internal clock is halted. An interrupt to an embedded processor in the integrated circuit running a user application can also be generated. The output of at least one synchronous logic element can be forced to a desired state while the internal clock is halted. The clock can then be restarted or stepped.

In one embodiment of the present invention, the internal clock inside the integrated circuit is halted in response to an external command from a debug application. In another embodiment, the internal clock inside the integrated circuit is halted in response to an external trigger signal applied to the integrated circuit. In another embodiment, the internal clock inside the integrated circuit is halted in response to the assertion of a signal at a selected node in the user circuit. In another embodiment, the internal clock inside the integrated circuit is halted in response to execution of a selected instruction in an embedded processor in the integrated circuit running a user application. In other embodiments, an interrupt to an embedded processor in the integrated circuit running a user application is generated in response to the event halting the internal clock. In other embodiments, a clock driving an embedded processor in the integrated circuit running a user application is halted simultaneously with halting the internal clock driving synchronous logic elements.

According to another aspect of the present invention, the output of at least one synchronous logic element is forced to a desired state while the internal clock is halted. In one embodiment, the internal clock is restarted for a single clock pulse following forcing the output of at least one synchronous logic element to a desired state and then halted again. The states of all synchronous logic elements programmed into the integrated circuit are again read after the internal clock is halted following the single clock pulse. In another embodiment, the internal clock is restarted following forcing the output of at least one synchronous logic element to a desired state and then later halted again. The states of all synchronous logic elements programmed into the integrated circuit are again read after the internal clock is halted for the second time.

BRIEF DESCRIPTION OF THE DRAWINGS

Additional advantages and details of the invention are explained below with reference to the exemplary embodiments illustrated in the accompanying schematic figures, in which like reference numbers identify like parts throughout.

DESCRIPTION OF THE INVENTION

Persons of ordinary skill in the art will realize that the following description of the present invention is illustrative only and not in any way limiting. Other embodiments of the invention will readily suggest themselves to such skilled persons.

The spatial debug concept and technique of the present invention addresses the problems and overcomes the limitations of the prior art techniques.

From a purely spatial perspective, the digital signals constitute a picture that represents the state of all of the synchronous elements in the design on a given clock edge, i.e., at one given instant of time. The spatial view of a design under test (DUT) is, thus, a snapshot of the states of all of the synchronous elements at a given instant of time, and can be practically obtained by halting the DUT clock and then reading the states of all of the synchronous elements in the DUT, sequentially.

The spatial snapshot technique is a hardware breakpoint applied during on-chip debugging. As a further generalization, the spatial snapshot can be expanded to include the firmware state at the instant the hardware breakpoint is applied.

The spatial capture is a snapshot view of the DUT and can be used to overlay or back-annotate stimulus/response (i.e., readback values) on structural representation of the DUT. An example of the snapshot view of the stimulus/response can be a frame or sequence of transactions caught in the moment as it gets generated, propagated, consumed, stored, etc. by various structural components in the design. The spatial capture or snapshot portrays parallel (simultaneous) activities distributed in the FPGA logic spanning the die. A single such snapshot, if taken at the right time using the right triggers, can reveal bugs (illegal state values) or bugs in transit or concurrent illegal states in the DUT.

In contrast to the spatial capture, a chronological capture of the DUT records successive cause and effect phenomena (i.e., stimulus and response, respectively) for a given small set of interfaces or group of synchronous elements. In the spatial capture, just the effect on (response of) the entire DUT to a stimulus applied in the previous clock cycle is captured. Mapping the spatial capture (response) of the DUT to its logic structure is very useful for tracing transactions as they flow through the design and enables quick diagnosis.

Figure 1:
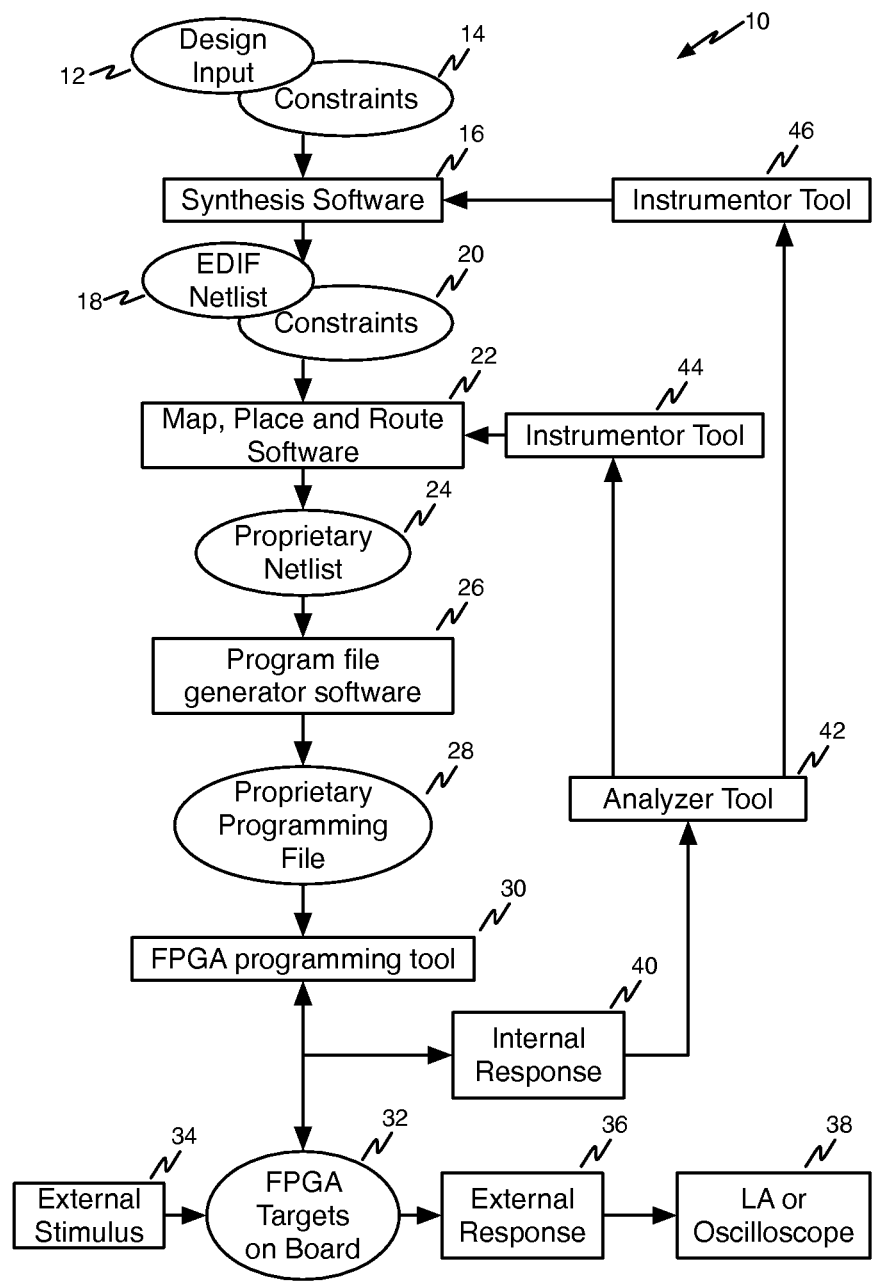
FIG. 1 is a flow diagram illustrating a prior art approach for debugging a system-on-a-chip design.
Figure 2:
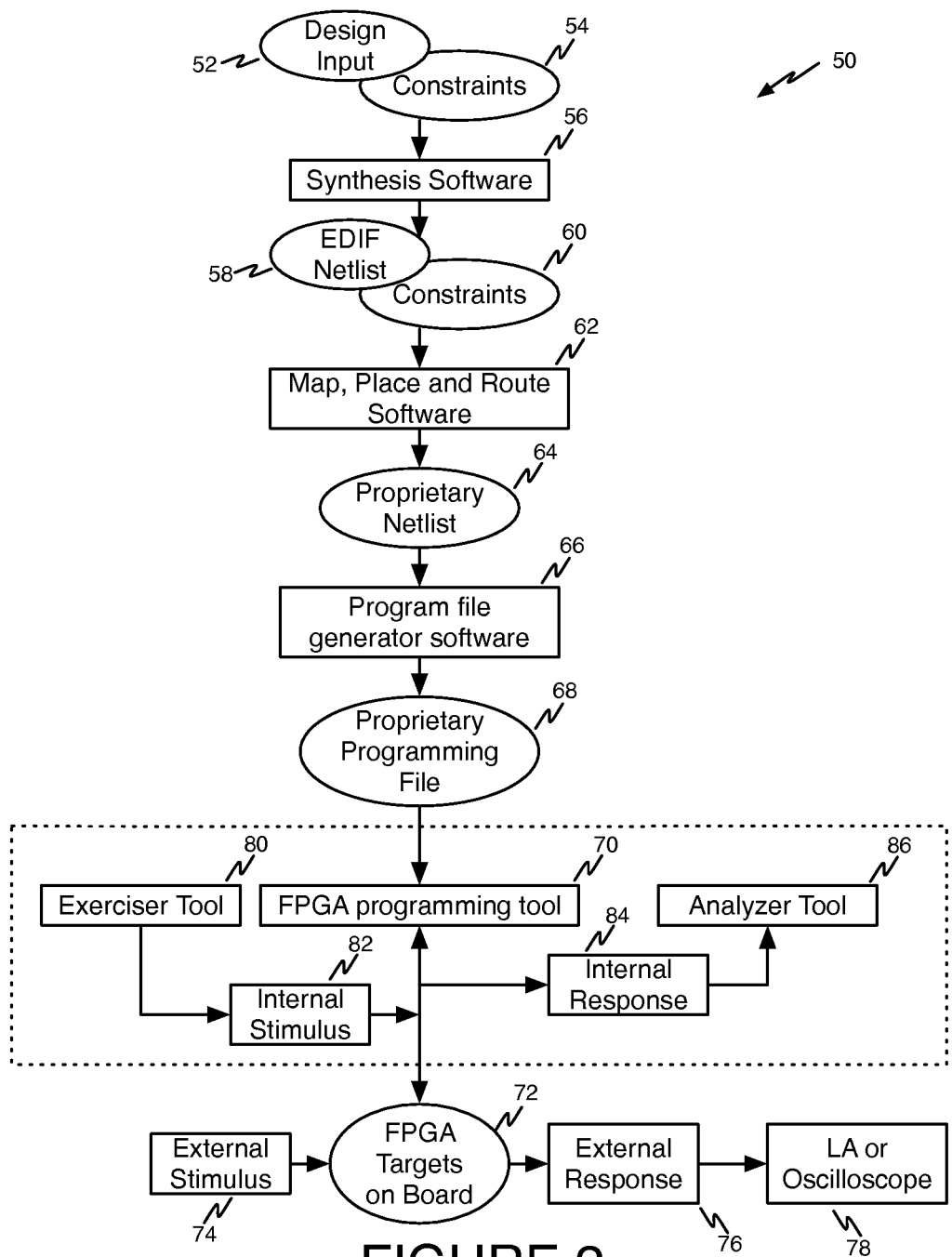
FIG. 2 is a flow diagram illustrating an approach for debugging a system-on-a-chip design in accordance with the present invention.

Referring now to FIG. 2, a flow diagram depicts a simplified debug flow in accordance with the present invention, indicated generally at reference numeral 50. At reference numeral 52, a circuit design is input to the system along with design constraints 54. At reference numeral 56, the circuit design 52 and constraints 54 are provided to synthesis software, which produces an EDIF netlist at reference numeral 58, along with constraints 60. The EDIF netlist 58 and constraints 60 are provided to map, place, and route software 62 to produce a proprietary netlist 64. The proprietary netlist 64 is provided to program file generator software 66 to produce proprietary programming file 68. At reference numeral 70, an FPGA programming tool is used to program the design into an FPGA integrated circuit 72 on a circuit board. This portion of the process is the same as the front end of the prior art process depicted in FIG. 1.

After the integrated circuit has been programmed, an external stimulus can be applied to the system including integrated circuit 72 at reference numeral 74. At reference numeral 76, the external system response to the stimulus is captured and presented to oscilloscope or logic analyzer 78. This stimulus and response is the same as that of the prior art debug process of FIG. 1.

An exerciser tool 80 can be employed to provide an internal stimulus 82 to the FPGA integrated circuit 72 that can provide an internal response 84. The exerciser tool 80 is an application running on a PC that allows a user to prepare the internal stimulus and to playback the internal stimulus as per user specification and user-defined trigger. The internal stimulus 82 is a logical vector sequence (of 1s and 0s) applied at the input of device pins or any synchronous element in the design, such as a register or a memory element (SRAM). The internal stimulus may be a single logic vector or a sequence of logic vectors. The SmartDebug tool controls the FPGA embedded execution control block (ECB) to sequence chronologically the internal stimulus to the design under test (DUT). The internal response 84 is a logical vector sequence (of 1s and 0s) captured by the SmartDebug system (the FPGA embedded ECB, FPGA embedded active and live probe logic, FPGA embedded SmartDebug interface logic). The internal response can be monitored for any arbitrary signal in the DUT. Analyzer tool 86 is an application running on a PC that allows the user to select arbitrary triggers while DUT is running, arms the FPGA embedded ECB and waits to download an internal response, and then display it typically in the form of a spatial capture (states of all synchronous elements in the design). For a given (known) stimulus vector sequence, it is possible to create a simulation-like database of the design when the analyzer tool is coupled with the exerciser tool to apply the stimulus and observe the state of the design.

As will be observed by persons of ordinary skill in the art, the debug procedure illustrated in FIG. 2 avoids the multiple loops from analyzer tool 42 to instrumentor tool 44 to map, place, and route software 22, and from analyzer tool 42 to instrumentor tool 46 to synthesis software 16 in FIG. 1. The avoidance of repeating these loops multiple times results in a savings of hours of debugging time for an FPGA user design, as well as savings of computer infrastructure and EDA licensing costs.

The SmartFusion2 FPGA integrated circuit available from Microsemi SoC Corporation contains technology built into the FPGA to create visibility and controllability into the user design without the requirement of undergoing instrumentation cycles, enabling efficient, non-intrusive debugging according to the present invention. The SmartFusion2 FPGA has proprietary built-in hard-wired switches embedded in the configurable fabric array (hereinafter referred to as the fabric) that enable access to synchronous elements without affecting the structure of the user design being debugged.

The SmartFusion2 FPGA contains several salient features built into the silicon architecture of the FPGA. First, embedded, hardwired live probes can be moved around the FPGA fabric simply by issuing a specific JTAG command (LIVEPROBE). Live probes can be used to monitor internal flip-flop outputs in time continuum, by way of routing them interactively, i.e., in-situ while user design is running, to a reserved pair of external pins for probing with external logic analyzer or to internal flip-flop inputs for probing with embedded logic analyzer.

A virtual probe can sample the digital state of any flip-flop output simply by issuing a specific JTAG command (PROBERD). Another virtual probe can override the digital state of any flip-flop input simply by issuing a specific JTAG command (PROBEWR).

There is a JTAG/SPI bus interface that can access (read and write) via specific commands (SIIWR and SIIRD), embedded memories, SERDES registers, DDR2/DDR3 Memory Controller registers, SoC memory-mapped registers, etc. Glitchless clock gating of the user design clock is provided. Dedicated signals from the embedded hardened SoC processor (e.g., CortexM3 processor, TxEV, RxEV, and INT signals) can be employed in aid of the debug solution.

These salient features embedded in the SmartFusion2 FPGA architecture enable powerful debug solutions that tackle many of the problems of the prior art debugging systems. The architecture can be exploited together with specific tools, IPs, software, and debug methodologies to provide 100% on-chip visibility, 100% on-chip controllability, non-iterative debugging, structurally non-intrusive debugging, and execution control. These features are described in documentation for the SmartFusion2 FPGA products that is available for download at https://www.actel.com/products/smartfusion2/default.aspx. This documentation is expressly incorporated by reference herein.

The glitchless multiplexer available in SmartFusion2 CCC (clock conditioning circuit) hardIP core can be turned ON to expose the GLx_ENB input signal that controls the clock output GLx. The GLx output is the gated clock that drives the user design. This feature of the SmartFusion2 FPGA products is shown in FIG. 3.

Figure 3:
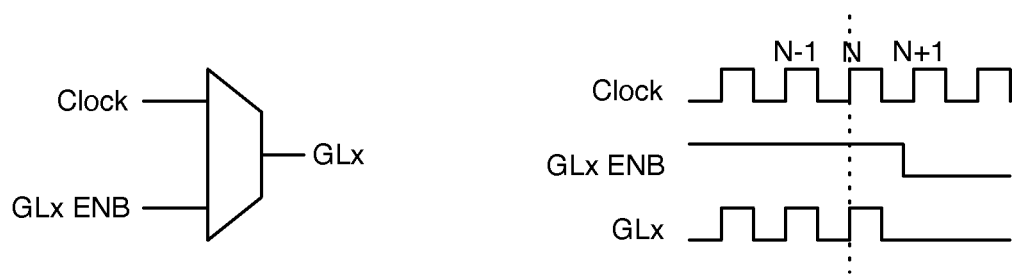
FIG. 3 is a diagram showing a typical user interface for a clock conditioning circuit configurator for system-on-a-chip FPGA spatial debugging using a single snapshot in accordance with the present invention.

As shown in FIG. 3, the CCC can be employed to control the design clock to gate it off by changing the value of GLx_ENB from '1' to '0'. Doing so causes output clock GLx to return to '0' in a glitchless manner, regardless of the transition edge of GLx_ENB signal with respect to the clock. Since the GLx_ENB goes to '0' in Nth clock cycle, the clock output GLx goes to '0' in the Nth clock cycle and remains '0' in the (N+1)th clock cycle, and henceforth as long as GLx_ENB stays '0'.

The effect on the DUT, clocked by GLx, is that it will come to a standstill, because all of the synchronous elements in the design can no longer change state. As a result, the digital signals inside the DUT become pseudo-static for the duration that GLx_ENB stays '0'.

Figure 4:
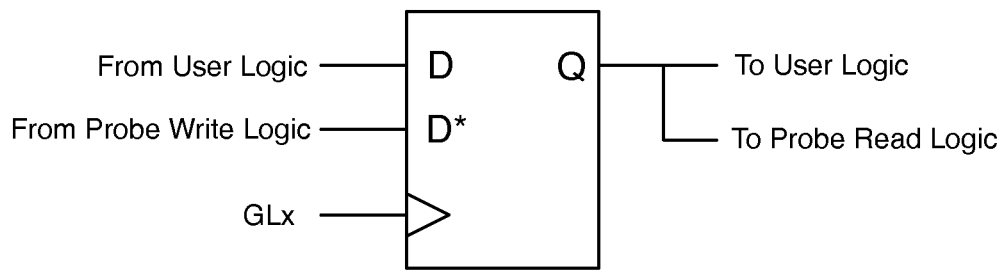
FIG. 4 is a diagram showing Virtual Probing: ProbeRead and ProbeWrite.

The proprietary flip-flop virtual probing technology developed by Microsemi SoC Corporation and also in SmartFusion2, originally intended for design-for-test (DFT) purposes, depicted in FIG. 4, now allows pseudo-static signals to be read reliably using the ProbeRead JTAG command. When GLx CLK is frozen, the Q output of the flip flop is pseudo-static and can be reliably tapped by the probe read logic. The ProbeWrite JTAG command can be issued to load a value into the D* input of the flip flop. The D* input overrides the Q output of the flip flop asynchronously. There is additional control circuit not shown here that drives the probe write logic. From the user perspective, the ProbeRead and ProbeWrite features of the flip flop are completely hidden and the control logic that drives it is transparent to the user. All the flip-flops in the Microsemi fabric logic support ProbeRead and ProbeWrite commands.

Figure 5:
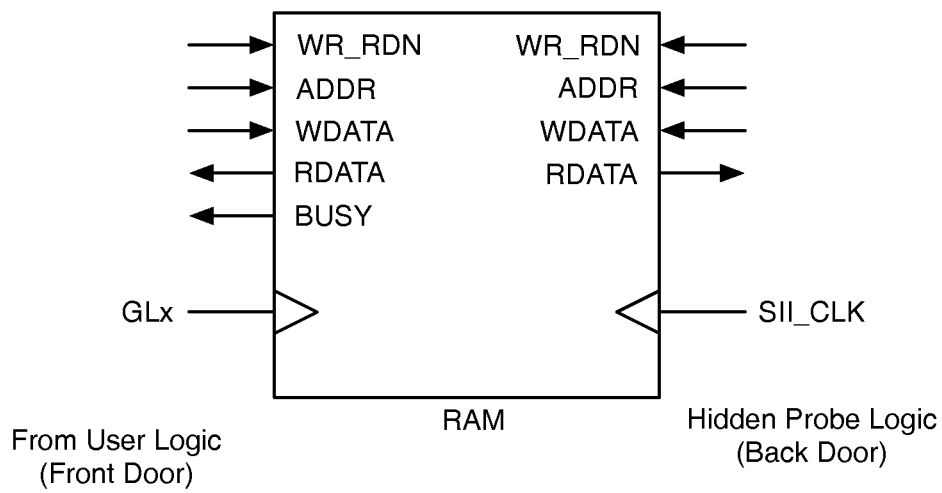
FIG. 5 is a diagram showing Virtual Probing: SIIRD and SIIWR.

The proprietary RAM probing technology developed by Microsemi and included in SmartFusion2, depicted in FIG. 5, allows distributed embedded RAM to be read reliably using the SIIRD JTAG command and written reliably using the SIIWR JTAG command. If the user clock GLx is frozen, then all user signals become pseudo-static.

Thus, by freezing (halting) the DUT clock GLx, it can be seen that the DUT assumes a pseudo-static state (i.e., all synchronous states are fixed), thereby enabling deterministic debug read/write operations of all flip flops and deterministic debug read/write operations of all embedded RAMs.

The act of freezing the DUT and reading back the state of the synchronous elements in the design forms the basic technique for creating 100% visibility and 100% controllability.

The SmartFusion2 device handles the task of executing debug commands, such as the PROBEWR, PROBERD, SIIWR, SIIRD (collectively referred to as virtual probes), LIVEPROBE (active or interactive probe) issued by an external controller or PC-based software tool. This tool shall be called SmartDebug henceforth in this document. The SmartDebug tool interacts with the debug logic via the dedicated device JTAG or SPI interface. Documentation for this PC-based software tool is available for download at https://www.actel.com/products/hardware/debug/default.aspx. This documentation is expressly incorporated by reference herein.

It should be noted that this methodology uses single-iteration instrumentation that is transparent to the user as shown in FIG. 2, in contrast to chronological capture methodology that requires multiple iterations of design-intrusive instrumentation in an attempt to create 100% visibility and 100% controllability as shown in FIG. 1.

A snapshot may be acquired based on many trigger sources. The SmartDebug tool can present the user with a variety of execution control options. In one embodiment, the internal clock inside the integrated circuit is halted in response to an external command to the FPGA, e.g., from a debug application. In another embodiment, the internal clock inside the integrated circuit is halted in response to an external trigger signal applied to the integrated circuit. In another embodiment, the internal clock inside the integrated circuit is halted in response to the assertion of a signal at a selected node in the user circuit in the FPGA fabric. In another embodiment, the internal clock inside the integrated circuit is halted in response to the TxEV pulse generated by or execution of a selected instruction in the embedded processor ARM CortexM3, in the integrated circuit running a user application. In other embodiments, an interrupt to an embedded processor in the integrated circuit running a user application is generated in response to the event halting the internal clock. In other embodiments, a clock driving an embedded processor in the integrated circuit running a user application is halted simultaneously with halting the internal clock driving synchronous logic elements. According to one aspect of the present invention, at any given time during the operation of the DUT, the user can switch arbitrarily among any of the four trigger sources.

Figure 7:
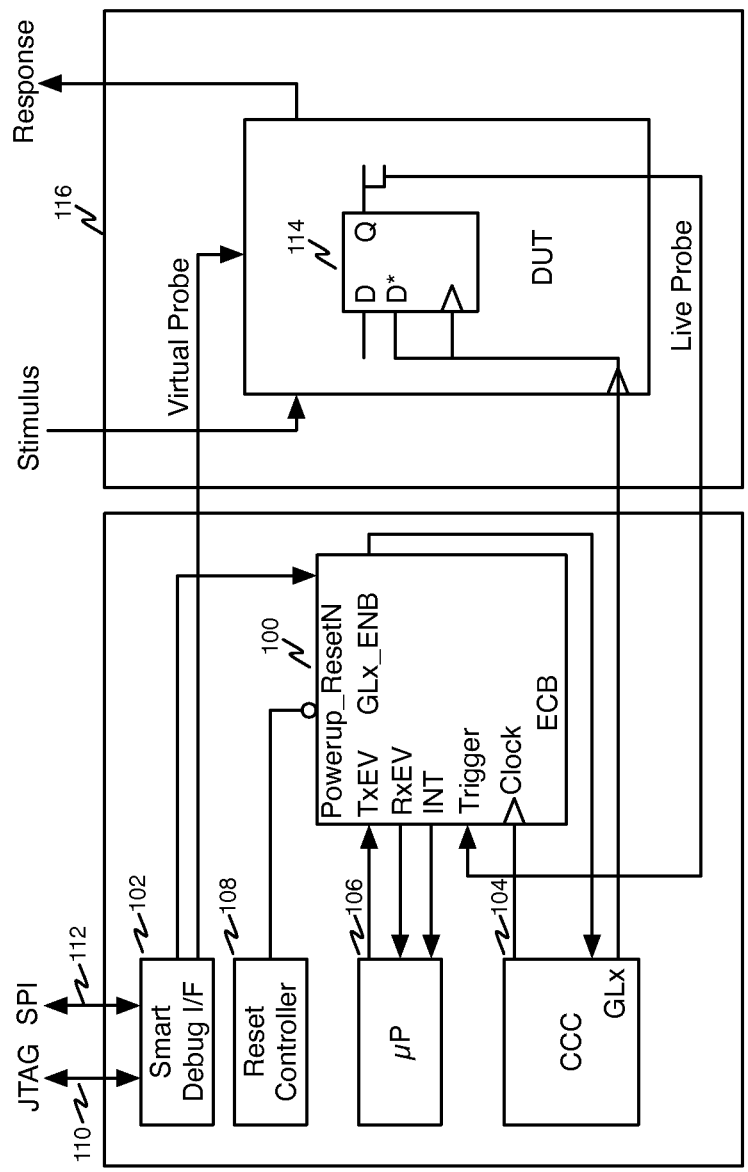
FIG. 7 is a diagram showing execution control provided by the execution control block.

Referring now to FIG. 7, a block diagram shows the execution and control block 100 and its relationship to other system components. The execution control block (ECB) 100 depicted in FIG. 7 may be an IP core programmed into the FPGA that handshakes with the SmartDebug utility running on a PC, shown at reference numeral 102. The ECB does not need to be debugged and may be considered as separate from the remainder of the user circuitry programmed into the FPGA as shown in FIG. 7 as a separate entity. The ECB is responsible for generating the clock gating signal GLx_ENB that is provided to the clock conditioning circuit 104 depicted in FIG. 3. It can be dynamically controlled by the SmartDebug tool while the design is in the operational state. The ECB is also coupled to the embedded microprocessor 106 in the FPGA integrated circuit. The ECB is also coupled to reset controller 108, whose function it is to supply a power-up reset signal to the ECB 100.

As may be seen in FIG. 7, the ECB 100 is configured by the SmartDebug tool via the dedicated JTAG or SPI interfaces of the device shown at reference numerals 110 and 112, respectively. The GLx output of the clock conditioning circuit 104 is also shown coupled to the clock input of an illustrative DUT 114 in user design 116 and the Q output of the DUT 114 in user design 116 is shown coupled to the trigger input of the ECB.

SmartDebug provisions specific register bits inside the ECB to operate it in snapshot mode. SmartDebug then provisions specific registers inside the ECB to control the select line of the mux that determines any of the four trigger sources. The hardwired trigger is driven by user-routed signal, such as from an FPGA input pin. This trigger source is useful when an external-to-chip event triggers an interesting event during which the snapshot is desired. TxEV driven by the CortexM3 is an extremely valuable trigger source during on-chip co-verification of firmware and hardware. The user can insert SEV instruction(s) in the embedded firmware to generate a snapshot or multiple snapshots. This is useful when a user desires a firmware-driven hardware breakpoint.

While the source of the trigger TxEV driven by the CortexM3 is fixed and hardwired trigger is static for a given design, the trigger driven by any user-defined flip-flop in the DUT and the forced (manual) trigger from the SmartDebug tool are dynamically configurable by the user while the design is running.

For the trigger driven by any user-defined flip-flop in the DUT to work, the SmartDebug must configure one of the two available live probes to interconnect the trigger source from within the DUT to the input port trigger of ECB. So, the user is able change the source of the trigger to be anywhere within the DUT on the fly (i.e., in-situ while the DUT is in its normal operational state).

Additionally, the RxEV handshake and INT interrupt lines can be asserted by the ECB in order to synchronize the firmware state with the DUT snapshot state. This is useful when a user desires a hardware-driven firmware breakpoint. In addition to its execution control features, the ECB will also be able to resume the clock after a clock-freeze, and/or generate a clock freeze followed by a single clock pulse.

Figure 8:
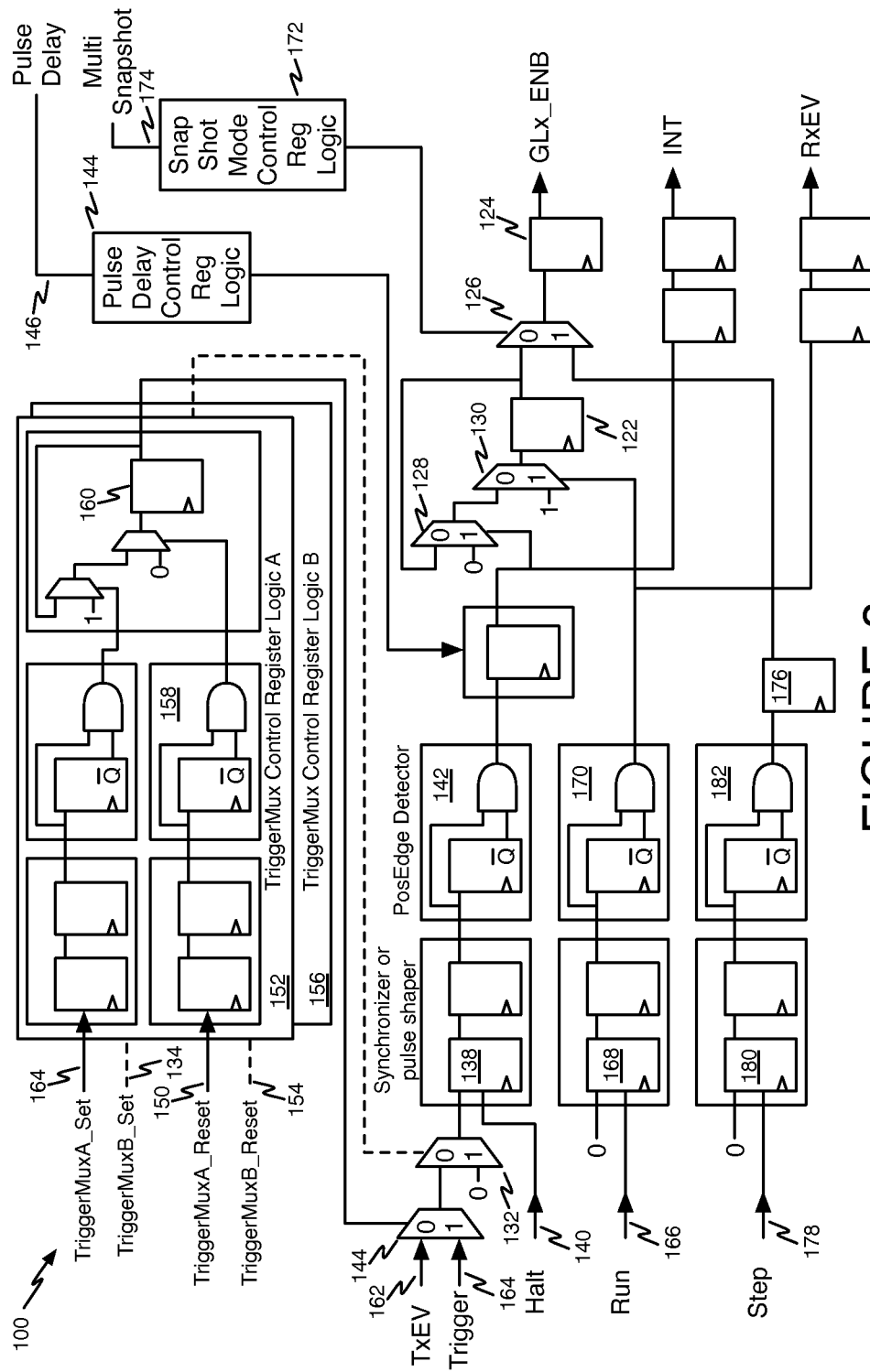
FIG. 8 is a block diagram of the execution control block.

Referring now to FIG. 8, a block diagram of the ECB 100 is presented. In the following discussion, the operation of ECB 100 will be disclosed.

In order to obtain a free running clock in which GLx_ENB is asserted ('1') upon power-up reset, all flip-flops are placed in '0' state, except the two flip-flops 122 and 124, which are set equal to '1'. The power-up state will configure a select line of multiplexer 126 to be '0', thus passing through the output of register 122 to the input of register 124. The select inputs of multiplexers 128 and 130 are set to select '0', thereby feeding back the output of the register 122 to itself. So, the register 122 remains in state '1', and register 124 remains in state '1'. Upon power-up, and during untriggered operation, ECB 100 thus enables a free-running clock.

The synchronizer circuits shown in ECB 100 in FIG. 8 are meant to load the ProbeWrite value from the virtual signals into the first stage of the flip flop, asynchronously via its D* input. The clock and D inputs of this flip flop can be tied to Vcc (logic state 1), effectively turning this flip flop into a latch, as shown in FIG. 9.

Figure 9:
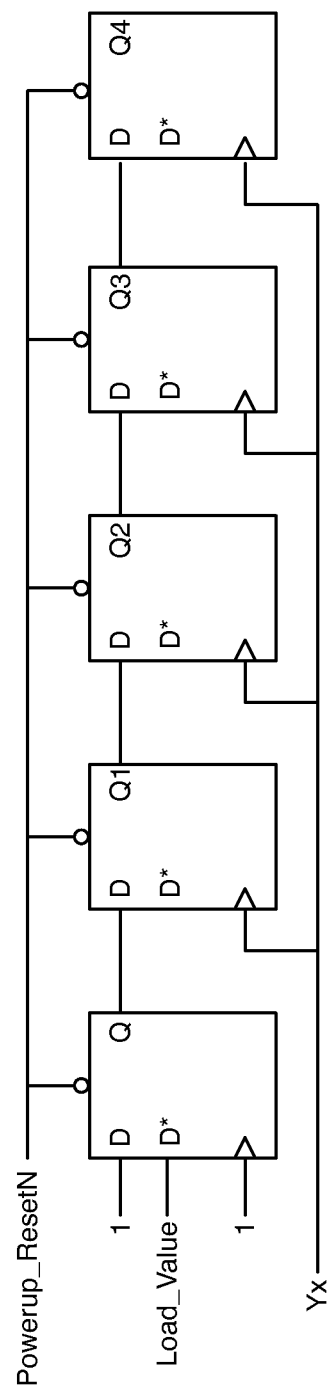
FIG. 9 is a diagram showing a PROBEWR synchronizer circuit.

The subsequent four flip flops of FIG. 9 synchronize the output Q of the latch into ECB clock domain, Yx. Normally, Yx has a frequency that is much higher than the virtual probe signal frequency. So, the output Q of the latch will always behave as if it were an asynchronous, yet pseudo-static signal in the Yx clock domain. Thus, with the PROBEWR synchronizer circuit, the virtual probe signal is faithfully converted into the user clock domain signal. This may be regarded as a bridge between the virtual probe signal and the user circuit, a building block of the ECB.

To provide a manual halt trigger, SmartDebug needs to provision the select input of multiplexer 132 to be '1'. It does so by asserting the virtual signal "TriggerMuxB_Set" 134 shown in FIG. 8, by issuing ProbeWrite commands (0→1). Asserting this "TriggerMuxB_Set" signal 134 will cause the TriggerMuxB register (not shown) in TriggerMux Control Register Logic B 156 to load the value '1' asynchronously, which will get sampled by the following register chain in the synchronizer module. A PosEdge Detector circuit in TriggerMux Control Register Logic B 156 (not shown) detects the rising edge resulting from the assertion of the "TriggerMuxB_Set" signal 134, and generates a pulse ('0→1→0') that is exactly 1 clock cycle wide. This pulse will synchronously load the "TriggerMux Control Register B" (not shown) with the value '1'. This, in turn, feeds '1' into the select line of multiplexer 132, which outputs '0' in response.

A forced manual trigger is obtained by SmartDebug tool asserting (0→1) at the input of register 138, in response to the user pressing a button in the SmartDesign Execution Control GUI. As a result, the virtual 'Halt' signal shown at reference numeral 140 in FIG. 8 gets asserted. Asserting this 'Halt' signal 140 will cause the register 138 to load the value '1' asynchronously, which will get sampled by the following register chain in the synchronizer module. A PosEdge Detector circuit 142 in the Halt signal chain detects the rising edge resulting from the assertion of the 'Halt' signal 140, and generates a pulse ('0→1→0') that is exactly 1 clock cycle wide. The Pulse Delay Control Register Logic module 144 may delay the propagation of this pulse by a specific number of clock cycles, configurable via the 'Pulse Delay' virtual signal at reference numeral 146 provisioned apriori. The propagated pulse forces the select line of multiplexer 128 to be '1', selecting input '0' and, thus, register 122 samples and propagates the '0' on the following clock edge and retains this state, as the select lines for multiplexers 128 and 130 are driven to '0' in the subsequent clock cycles. This '0' state of register 122 propagates to register 124. And, thus, GLx_ENB transitions from '1→0'. Thus, by asserting the 'Halt' virtual signal via SmartDebug, the DUT clock GLx is halted or frozen.

To provide TxEV as a halt trigger, SmartDebug needs to provision the select inputs of multiplexers 132 and 144 to be '0'. It does so by asserting the virtual signals TriggerMuxA_Reset 150 to Trigger Mux Control Register Logic A 152 and TriggerMuxB_Reset 154 to TriggerMux Control Register Logic B 156 shown in FIG. 8, by issuing ProbeWrite commands (0→1). Asserting these signals will cause the registers to load the value '1' asynchronously, which will get sampled by the following register chain in the synchronizer module. A PosEdge Detector circuit (one such circuit 158 for Control Register Logic A is shown) detects the rising edge resulting from the assertion of the virtual signal, and generates a pulse ('0→1→0') that is exactly 1 clock cycle wide. This pulse will synchronously load the TriggerMuxA Control Register 160 with the value '0'. This, in turn, feeds '1' into the select line of multiplexer 144. Likewise, an identical instantiation of the TriggerMuxB Control Register Logic 156 for multiplexer 132 will force the select input of multiplexer 132 to '1'. The TxEV input port trigger path is, thus, configured to connect to register 138. It is assumed that the CortexM3 processor, which is the ultimate source of the TxEV pulse on line 162, is clocked by the same source-synchronous clock as the ECB module; otherwise, an additional pulse-shaping and synchronizing circuit may need to be added.

PosEdge Detector circuit 142 detects the rising edge resulting from the assertion of the 'TxEV' signal, and generates a pulse ('0→1→0') that is exactly 1 clock cycle wide. The Pulse Delay Logic module 144 may delay the propagation of this pulse by a specific number of clock cycles, configurable via the 'Pulse Delay' virtual signal 146 provisioned apriori. The propagated pulse forces the select line of multiplexer 128 to be '1', selecting input '0' and, thus, register 122 samples and propagates the '0' on the following clock edge and retains this state, as the select lines for multiplexers 128 and 130 are driven '0' in the subsequent clock cycles. This '0' state of register 122 propagates to register 124. And, thus, GLx_ENB transitions from '1→0'. Thus, by asserting the 'TxEV' Input port, the DUT clock GLx is halted or frozen.

To provide a trigger input port as a halt trigger, SmartDebug needs to provision the select line of multiplexer 144 to '1' and the select line of multiplexer 132 to be '0'. It does so by asserting the virtual signals 'TriggerMuxA_Set' 164 in TriggerMuxA Control Register Logic A 152 and 'TriggerMuxB_Reset' 154 in TriggerMuxB Control Register Logic 156 shown in FIG. 8, by issuing ProbeWrite commands (0→1). Asserting these signals will cause both registers to load the value '1' asynchronously, which will get sampled by the following register chain in the synchronizer module. A PosEdge Detector circuit (one such circuit 158 for TriggerMuxA Control Register Logic 152 is shown) detects the rising edge resulting from the assertion of the virtual signal and generates a pulse ('0→1→0') that is exactly 1 clock cycle wide. This pulse will synchronously load the "TriggerMuxA Control Register" 160 with the value '1'. This, in turn, feeds the select input of multiplexer 144 to '1'. Likewise, an identical instantiation of the TriggerMuxB Control Register Logic 156 for multiplexer 132 will produce the select input of multiplexer 132 to '0'. The 'Trigger' input port trigger path 164 is, thus, configured to drive register 138.

It is assumed that the ultimate source driving the 'Trigger' input port 164 is clocked by the same source-synchronous clock as the ECB module; otherwise, an additional pulse-shaping and synchronizing circuit may need to be added. PosEdge Detector circuit 142 detects the rising edge resulting from the assertion of the 'Trigger' signal and generates a pulse ('0→1→0') that is exactly 1 clock cycle wide. The Pulse Delay Logic module 144 may delay the propagation of this pulse by a specific number of clock cycles, configurable via the 'Pulse Delay' virtual signal 146 provisioned apriori. The propagated pulse forces the select input of multiplexer 128 to be '1', selecting input '0' and, thus, register 122 samples and propagates the '0' on the following clock edge and retains this state, as the select lines for multiplexers 128 and 130 are driven to '0' in the subsequent clock cycles. This '0' state of register 122 propagates to register 124. And thus, GLx_ENB transitions from '1→0'. Thus, by asserting the 'Trigger' input port 164, the DUT clock GLx is halted or frozen. The 'Trigger' input port 164 can be driven from two distinct sources, one static and the other dynamic, as described in the below sections.

To provide a hardwired signal as the trigger source, the 'Trigger' input port 164 shown in FIG. 8 may be hardwired to an FPGA I/O input pin. This may be done during the initial design capture by the user or alternatively via post-layout probe feature using incremental place-and-route, but not while the design is running on-chip. Therefore, such a trigger source is configurable only statically prior to on-chip debugging. It is assumed that the trigger source asserts the signal for several clock cycles, effectively rendering it a pseudo-static signal. The synchronizer module will take care of synchronizing the trigger signal reliably to the clock domain of ECB.

To provide a DUT internal flip-flop as the trigger source if the 'Trigger' input 164 shown in FIG. 8 is not hard-wired, it remains an undriven input port until SmartDebug makes use of Liveprobe commands to configure one of the two available Liveprobes to connect 'Trigger' input port to the debug output port of a DUT flip flop. This connection can be adjusted dynamically, in-situ, while the design being debugged is running. It is assumed that the DUT flip flop asserts the signal for several clock cycles, effectively rendering it a pseudo-static signal, or that the DUT flip flop is of the same clock domain as ECB. In the latter case, the trigger signal can be asserted for a minimum duration of one clock cycle, assuming that Liveprobe connection does not introduce excessive routing delay.

To enable Run mode, SmartDebug needs to provision the select input of multiplexer 130 to be '1'. It does so by asserting the virtual signal "Run" 166 shown in FIG. 8, by issuing ProbeWrite commands (0→1). Asserting this 'Run' signal 166 will cause the register 168 to load the value '1' asynchronously, which will get sampled by the following register chain in the synchronizer module. A PosEdge Detector circuit 170 detects the rising edge resulting from the assertion of the 'Run' signal 166, and generates a pulse ('0→1→0') that is exactly 1 clock cycle wide. This pulse will synchronously force the select input of multiplexer 130 to be '1', selecting input '1' and, thus, register 122 samples and propagates the '1' on the following clock edge and retains this state, as the select input for multiplexer 128 is driven to '0' and select input for multiplexer 130 is driven to '1' in the subsequent clock cycles. This '1' state of register 122 propagates to register 124. And, thus, GLx_ENB transitions from '0→1', if not already '1'. Thus, by asserting the 'Run' virtual signal 166, SmartDebug restarts or un-freezes the DUT clock GLx.

To enable Step mode 178, SmartDebug needs to provision the select input for multiplexer 126 to be '1'. It does so by asserting the virtual signal 'Multi-Snapshot_Set', not explicitly shown in FIG. 8. A module entitled "SnapShot Mode Control Register Logic" 172 is an identical instantiation of "TriggerMux Control Register Logic" modules 152 and 156. Asserting the 'Multi-Snapshot_Set' signal 174 will cause the register to load the value '1' asynchronously, which will get sampled by the following register chain in the synchronizer module. A PosEdge Detector circuit (not shown) detects the rising edge resulting from the assertion of the 'Multi-Snapshot_Set' signal 174 and generates a pulse ('0→1→0') that is exactly 1 clock cycle wide. This pulse will synchronously load the "SnapShot Mode Control Register" 172 with the value '1'. This, in turn, feeds the select input of multiplexer 126 to '1'. The Step trigger path is, thus, established between the virtual signal 'Step' and the registers 124 and 176 by the SmartDebug tool.

The virtual 'Step' signal 178 is shown in FIG. 8. Asserting this 'Step' signal 178 will cause the register 180 to load the value '1' asynchronously, which will get sampled by the following register chain in the synchronizer module. A PosEdge Detector circuit 182 detects the rising edge resulting from the assertion of the 'Step' signal 178 and generates a pulse ('0→1→0') that is exactly 1 clock cycle wide. This 1-clock-cycle wide pulse propagates via register 176 to register 124. And, thus, GLx_ENB transitions from '0→1→0'. Thus, by asserting the 'Step' virtual signal via SmartDebug, the DUT clock GLx is advanced by one clock cycle.

Choosing the appropriate trigger is crucial to creating a meaningful snapshot and debug scenario. Explaining how to choose the right trigger is beyond the scope of this disclosure, as this process is highly design-dependent.

Figure 6:
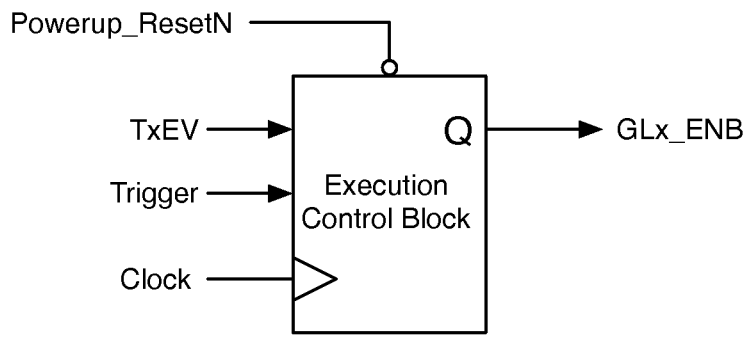
FIG. 6 is a diagram showing an execution control block (ECB).
Figure 6:
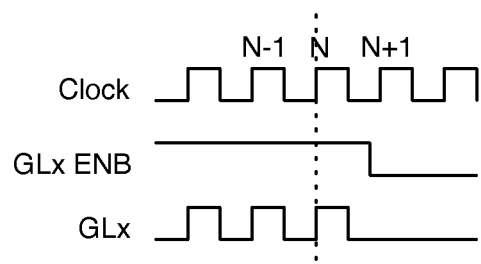

Assuming that the user has intelligently chosen the appropriate trigger signal, when the DUT Clock GLx is halted, the DUT FSM (all flip flops and RAMs) can be read back using multiple ProbeRead commands. SmartDebug can ascertain that the trigger fired a clock-freeze by simply reading status of the register 122 (see FIG. 8), as indicated in FIG. 6. If the register 122=0, then the DUT is frozen and all signals are static and available for extraction via ProbeRead and SIIWR commands. SmartDebug can thus put together a snapshot of the state of all flip flops, RAMs, and hard IPs.

By having SmartDebug back-annotate these values into the user HDL or schematic capture, an intelligent and swift analysis can be made by the user to locate and isolate any bugs in the DUT.

A snapshot can be used in hardware-firmware co-verification. Consider the case in which the DUT is a soft peripheral whose interaction with the driver layer firmware running on the embedded SoC processor is of interest. In case of SmartFusion2, CortexM3 processor exists.

It may be desirable to freeze the SoC based on a trigger from the hardware. In the aid of hardware-firmware co-verification, the trigger used to freeze the DUT can also be used to trap the user firmware execution via an interrupt. The user firmware is being executed by the hardened processor. At the interesting trigger event, the interrupt generated by ECB will trap the firmware into an interrupt handler. The ICE tool can be then used to watch the firmware variables, CPU registers, and system memory. Therefore, a complete snapshot of both the hardware and firmware is obtained.

The downside of this approach to freeze the firmware during the snapshot is that the Interrupt Subroutine Handler must restore program execution when it is desired to unfreeze the DUT and continue operation of the firmware. However, popping the program counter value from the stack to resume firmware execution prior to DUT snapshot will add a few clock cycles delay. So, the instant at which firmware resumes, main program execution is delayed with respect to the DUT clock.

The trigger used to freeze the DUT can also be used to freeze the clock of the embedded processor. This would render the firmware debugger (ICE) useless. But, because the processor clock will be frozen at the same instant as the DUT clock, and released at the same instant as the DUT clock, therefore, both the firmware and DUT will operate in true lock-step. This mode of freezing the firmware has the advantage that an ISR does not get inserted artificially into the firmware execution. In other words, such a freeze preserves time-variant behavior of the firmware in its interaction with the hardware (DUT). Of course, for this to work, the embedded processor must run at the same clock frequency as the DUT.

In another debug scenario, it may be desirable to freeze the SoC based on a trigger from the firmware. The breakpoint set in the firmware would need to create a pulse to ECB so that it freezes the DUT. The TxEV input port 162 or the Trigger input port 164 of the ECB may be exploited to achieve this. Depending upon the specific implementation in the ICE, this may introduce a minor delay between the instant that the firmware breaks versus the instant the DUT freezes.

In certain debug scenarios, if the user is able to control the stimulus vector SV(n) so as to disable it, or render it momentarily ineffective to the portion of the DUT being debugged, then the user could use SmartDebug with an appropriate trigger in ECB to freeze the DUT clock. Once in the frozen state, the user could manipulate the state of the logic in the DUT. To make SmartDebug user-friendly, this will require annotation of the HDL signal into the appropriate ProbeWrite commands. SmartDebug issues a bunch of ProbeWrite commands to effect asynchronous loading of values of the user-selected flip flops in DUT. Upon completion of the ProbeWrites to the DUT, the SmartDebug tool can allow the user to perform further execution control, such as run control, to continue clocking the DUT after making the modification(s) and step control to enable subsequent snapshot(s).

One example of debug usecase is if it is desired to reset a misbehaving submodule in the DUT to see if it recovers from a stuck state or illegal state. Another debug usecase would be to inject errors and see if the error detection logic catches it, and whether such errors are visible by firmware when performing firmware-hardware co-verification. Another debug usecase is to manipulate FSMs into difficult to reach states. Still another application would be to assert interrupt sources in the DUT that are difficult to achieve with external stimuli, e.g., counter or FIFO overflow, and then see if the firmware executes the appropriate ISR. This is very useful in firmware-hardware co-verification.

Still another application would be to mimic a firmware transaction that firmware may not have been able to produce easily. This is again a useful feature during firmware-hardware co-verification.

In the aid of hardware-firmware co-verification, it is useful to analyze the interaction of the DUT, e.g., a soft peripheral, with the driver layer firmware. After the DUT is modified during the snapshot stage, the instant at which it is then re-run (step or run) can also be used to gate the firmware run by CortexM3. The firmware execution can be frozen with an inline assembly instruction "WFE". The firmware wakes up only when the RxEV signal is asserted by ECB, which happens when SmartDebug is done modifying the DUT and re-enables the DUT clock.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

The invention claimed is:

1. A method for performing on-chip spatial debugging of a user circuit programmed into a user-programmable integrated circuit to be provided to a user, the method comprising:
   operating the integrated circuit in a system for which the user circuit was designed;
   halting during an Nth clock cycle an internal clock driving synchronous logic elements in the integrated circuit in response to an output state transition of a sequential logic element in the integrated circuit triggered by a clock transition occurring during the Nth clock cycle, the sequential logic element being arbitrarily selected from among all of the synchronous logic elements in the integrated circuit during performance of the on-chip spatial debugging of the user circuit;
   reading the states of at least some of synchronous logic elements programmed into the integrated circuit while the internal clock is halted;
   while the internal clock is halted, forcing an output of at least one synchronous logic element to an arbitrary desired state selected during performance of the on-chip spatial debugging of the user circuit; and
   restarting the internal clock.

2. The method of claim 1 further comprising generating an interrupt to an embedded processor in the integrated circuit running a user application in response to the output state of the sequential logic element in the integrated circuit.

3. The method of claim 1 wherein restarting the internal clock comprises restarting the internal clock for a single clock pulse following forcing the output of at least one synchronous logic element to a desired state, the method further comprising:
   halting the internal clock following the single clock pulse;
   reading the states of all synchronous logic elements programmed into the integrated circuit after the internal clock is halted following the single clock pulse.

4. The method of claim 1 further comprising halting a clock driving an embedded processor in the integrated circuit running a user application simultaneously with halting the internal clock driving synchronous logic elements.

5. The method of claim 1 wherein reading the states of at least some of synchronous logic elements programmed into the integrated circuit while the internal clock is halted comprises reading the states of all of the synchronous logic elements programmed into the integrated circuit while the internal clock is halted.

* * * * *